United States Patent [19]
Takano et al.

[11] Patent Number: 5,710,847
[45] Date of Patent: Jan. 20, 1998

[54] SEMICONDUCTOR OPTICAL FUNCTIONAL DEVICE

[75] Inventors: Hideaki Takano, Kokubunji; Hirohisa Sano, Niiza; Tatsuo Kanetake, Kodaira; Masaki Ohira, Kanazawa-ku; Makoto Suzuki, Kokubunji; Hiroaki Inoue, Hidaka, all of Japan

[73] Assignee: Hitachi, Ltd., Tokyo, Japan

[21] Appl. No.: 593,051

[22] Filed: Jan. 29, 1996

[30] Foreign Application Priority Data

Feb. 3, 1995 [JP] Japan .................................. 7-016642

[51] Int. Cl.$^6$ ............................ G02B 6/26; G02B 6/42
[52] U.S. Cl. .................................................... 385/28
[58] Field of Search ............................ 385/2, 8, 10, 27, 385/28, 31, 147; 372/20, 45, 46, 12, 22, 99, 102

[56] References Cited

PUBLICATIONS

Electronics Letters Aug. 31, 1989, vol.25 No. 18, "Band Travelling-Wave Semiconductor Optical Amplifiers With Window Facet Structure" pp. 1241-1242.

Electronics Letters, Sep. 10, 1987 vol.23, No. 19, "Fabrication and Performance of 1.5 GaInAsP Travelling-Wave Laser . . . " pp. 990-991.

Institute of Electronics and Communication Engineers of Japan, MW 94-33, OPE94-26 (1994-6) pp. 67-72.

*Primary Examiner*—Akm E. Ullah
*Attorney, Agent, or Firm*—Antonelli, Terry, Stout, & Kraus, LLP

[57] ABSTRACT

To obtain an optical functional device such that the reflectivity of a facet and the loss of coupling with a fiber are reduced, a mode conversion region for changing the beam spot size is formed on the input facet and/or the output facet in an optical function region and the facet of the side to be connected with a fiber in the mode conversion region is formed obliquely to the direction of propagation of light.

13 Claims, 14 Drawing Sheets

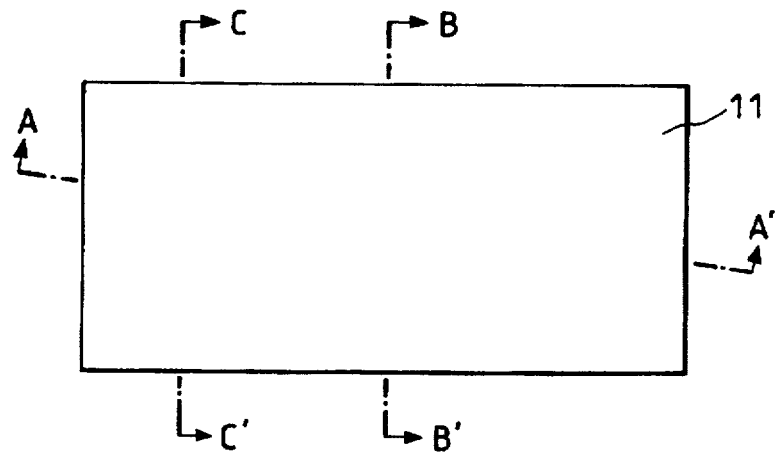
FIG. 7(a)
FIG. 7(b) A-A'
FIG. 7(c) B-B'    FIG. 7(d) C-C'
 

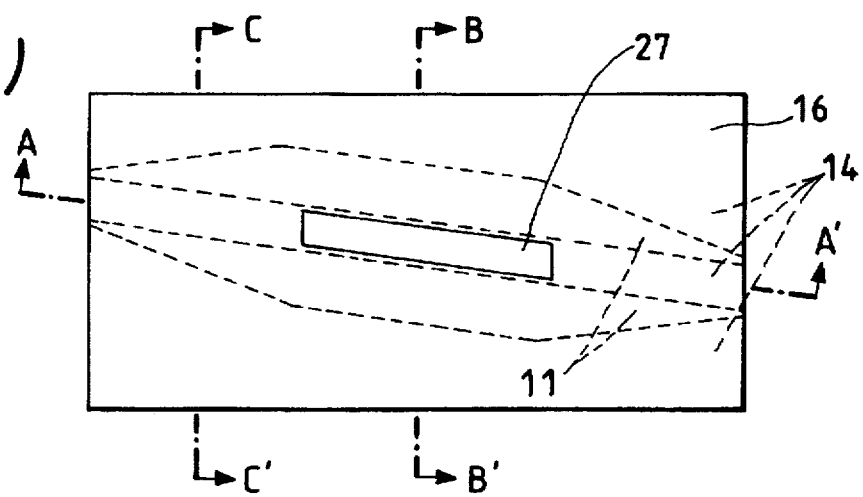
FIG. 9(a)
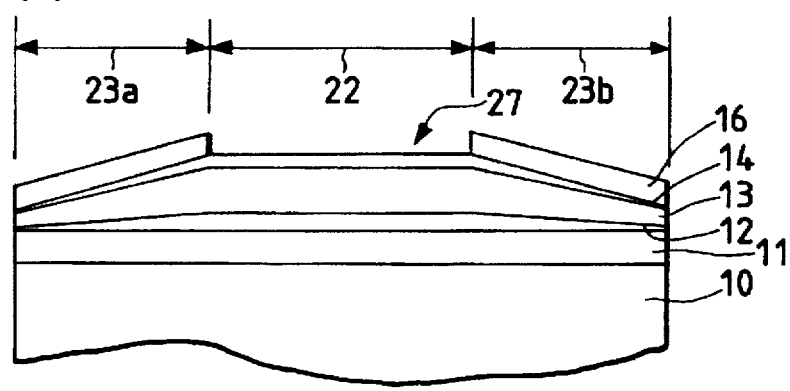
FIG. 9(b) A-A'
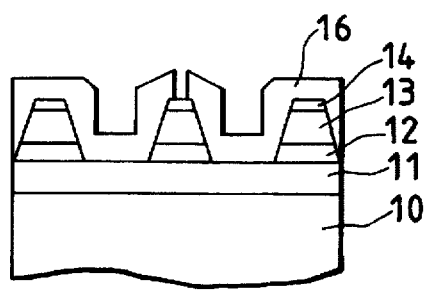
FIG. 9(c) B-B'
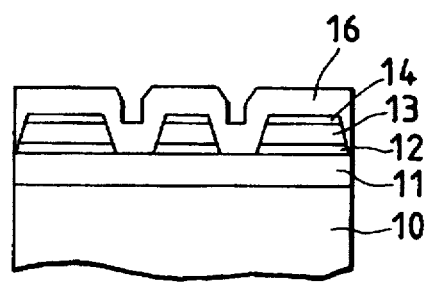
FIG. 9(d) C-C'

FIG. 13(d) C-C'

SEMICONDUCTOR OPTICAL FUNCTIONAL DEVICE

BACKGROUND OF THE INVENTION

The present invention relates to a semiconductor optical functional device such as a semiconductor laser, a semiconductor optical amplifier, an integrated light source obtained by integrating a semiconductor laser and a semiconductor optical amplifier, an optical switch, or an optical modulator, particularly to a semiconductor optical functional device capable of decreasing the facet reflectivity and moreover decreasing the loss of optical coupling with a fiber.

This type of a semiconductor optical functional device is used for optical communication or information processing. However, because deterioration of characteristics due to reflected returning light is a big problem, various structures for decreasing the facet reflectivity have been proposed so far. Typical examples of them are a window structure and a waveguide structure.

The window structure, as shown by the schematic view of FIG. 14(a), is a structure for decreasing the facet reflectivity by forming a region 32 referred to as a window region made of a material with a band gap larger than that of an active region 31 between a facet of the active region 31 and a device facet 35 of a semiconductor optical functional device 30 such as a semiconductor laser or semiconductor amplifier. Propagated light 34 passing through a waveguide 33 in the active region 31 is emitted from the facet of the active region 31 as a laser beam. Because the window region 32 serves as a transparent region absorbing no laser beam, the laser beam is propagated up to the device facet 35 serving as a reflection surface through the window region 32 in which the waveguide 33 is not formed while increasing the beam spot size by the diffraction effect and it is divided into a component to be emitted as transmitted light 36 and a component to be reflected on a reflecting surface, that is, reflected light 37 [shown by a two-dot chain line as an imperfect spherical wave in FIG. 14(a)]. The reflected light 37 reverses its traveling direction and is propagated toward the active region 31 again while increasing the beam spot size. Therefore, the reflectivity defined by the overlap integral of an incoming beam and a reflected beam is decreased because the beam diameter is increased. Moreover, in FIG. 14(a), symbol 40 represents a lens for converting the transmitted light 36 of the expanded incoming imperfect spherical wave into parallel rays, 50 represents a flat end fiber whose incident facet is flat, 51 represents a clad of the fiber, and 52 represents a core of the fiber, and solid lines at equal intervals in the core represent plane waves of the light passing through the core.

As a semiconductor optical functional device provided with the window region, a semiconductor optical amplifier is described in ELECTRONICS LETTERS, 31st Aug. 1989, Vol. 25, No. 18, pp. 1241–1242. In the semiconductor optical amplifier, an average facet reflectivity of 0.06% by forming 35 μm and 55 μm InP window regions at the both ends of an InGaAs active layer respectively is achieved and a combination of an antireflection film with a reflectivity of approx. 1% is used. That is, the semiconductor amplifier further decreases the facet reflectivity by a factor of ten or more by the window structure, compared to the facet reflectivity of 1% when using only an antireflection film.

An angled facet structure, as shown by the schematic view in FIG. 15, is a structure for decreasing the facet reflectivity by tilting a striped angled facet waveguide 38 including an active layer in a semiconductor optical functional device 30 such as a semiconductor laser or a semiconductor optical amplifier for 90° to the device facet 35 so that the waveguide is diagonally set. Thus, the propagated light 34 passing through the angled facet waveguide 38 is emitted from the device facet 35 as transmitted light 36, but it is not propagated though it has a component reflected from the device facet 35 of a reflecting surface because most of the reflected light 37 is produced in the direction symmetrically with respect to the normal to the facet on the opposite side of the waveguide. Therefore, the reflectivity defined by the overlap integral of an incoming beam and a reflected beam is decreased.

As a semiconductor provided with an angled facet waveguide, a laser amplifier is described in ELECTRONICS LETTERS, 10th September, 1987, Vol. 23, No. 19, pp. 990–991. In the laser amplifier an average facet reflectivity of 0.2% is achieved without using an antireflection film by tilting a waveguide including an InGaAsP active layer by 7° to a cleavage face. That is, the laser amplifier decreases the facet reflectivity by a factor of a hundred or more by the angled facet structure, compared to the ordinary facet reflectivity of 30% when no antireflection film is used.

SUMMARY OF THE INVENTION

However, the above-described window structure has a problem that the cost increases because it is necessary to couple an output beam with the flat end fiber 50 through the lens 40 for converting the spherical-wave transmitted light 36 to a plane wave as shown in FIG. 14(a) or by using a spherical lensed fiber 55 as shown in FIG. 14(b). Moreover, the usually-used lens 40 and the spherical lensed fiber 55 convert a complete spherical wave emitted from a light source to a complete plane wave. In the case of a semiconductor optical functional device using a window structure, however, the source of the light emitted from the waveguide 33 is a surface light source. Therefore, a problem arises that the transmitted light 36 becomes an incomplete spherical wave and a loss of coupling with a single-mode fiber is caused. A semiconductor optical amplifier having the above window structure makes it possible to decrease the facet reflectivity by a factor of ten or more by introducing the window structure. However, the loss of coupling with the fiber becomes larger than an ordinary value of 3 dB because the loss of each facet reaches 5 dB. Moreover, though a window structure is formed by burying-growth and cleavage, there arises a problem that the yield lowers because the process technique for control of the length of a window region formed by the burying-growth and cleavage belongs to a difficult category.

An angled facet structure has a problem that power consumption increases proportionally to a waveguide width though reduction of the reflectivity is improved proportionally to approx. the square of the waveguide width. In general, a waveguide width with which power consumption is low is approx. 1 μm. However, the waveguide width of approx. 1 μm has only a small reflectivity-decrease effect. Therefore, to improve the reduction of the reflectivity, it is necessary to increase a tilting angle. However, if the tilting angle is increased, a problem occurs that it is difficult to couple the device with a fiber because the light emitted from the facet greatly deviates from the normal to the facet in accordance with Snell's law. Moreover, because a lens system is used for coupling between the output beam and the fiber as shown in FIG. 15, a problem is brought up that the cost increases. Furthermore, because the source of the output beam is a surface light source, a problem arises that the transmitted light 36 becomes an incomplete spherical wave and the coupling loss further increases since the output beam is diagonally emitted and thereby, the output-beam intensity distribution deviates from a circular shape. According to the above-described laser amplifier having the angled facet structure, the facet reflectivity is decreased by a factor of a hundred or more by introducing the angled facet structure. However, power consumption approx. 5 times larger than the case of an ordinary waveguide width of 1 μm is required because the amplifier has a waveguide with a width of approx. 5 μm. Moreover, because the light emitted from a facet tilts up to 24° from the normal to facet, the loss of coupling with a fiber becomes larger than an ordinary loss of 3 dB because the loss of each facet reaches 7 dB. Furthermore, the angled facet waveguide is mostly formed by dry etching or wet etching having anisotropy in order to decrease the propagation loss in a waveguide. Because this type of anisotropic etching technique is subject to the influence of surface orientation, there is a problem that, as a tilting angle increases, it is more difficult to form a desired structure.

Therefore, it is an object of the present invention to provide a semiconductor optical functional device capable of decreasing the reflectivity of a facet and decreasing the loss of coupling with a fiber without complicating the fabrication process.

To achieve the above object, the semiconductor optical functional device of the present invention has a mode conversion region for changing the diameter of the beam of propagated light at the facet of an optical amplifier region of an optical amplifier, a semiconductor laser, or waveguide-type optical switch formed on a semiconductor substrate, in which the facet of the side of the mode conversion region to be connected with a fiber is provided diagonally to the propagation direction of the light.

In the case of the above semiconductor optical functional device, it is more preferable to form a guide layer with a band-gap wavelength shorter than that of an active layer which is a part of a layer forming the optical amplifier region and the mode conversion region at a position nearby the active layer.

Moreover, it is possible to constitute the semiconductor optical functional device of the present invention so that a mode conversion region for changing the diameter of the beam of propagated light is formed at the facet of the optical amplifier region of an optical amplifier, a semiconductor laser, or a waveguide-type optical switch formed on a semiconductor substrate through a bend waveguide, and the facet of the mode conversion region to be connected with a fiber is provided diagonally to the propagation direction of the light.

Also in this case, it is possible to further form a guide layer with a band-gap wavelength shorter than that of an active layer which is a part of a layer forming the optical amplifier region, a bend waveguide, and a mode conversion region at a position nearby the active layer.

Moreover, it is possible to form an optical amplifier region functioning as a waveguide-type optical switch having a plurality of waveguides and form a mode conversion region in each waveguide.

In this case, it is preferable to form a structure such that the beam divergence angle in the mode conversion region formed at each of the waveguides differs for each waveguide.

Moreover, it is possible to form a carrier-injection structure in the mode conversion region.

Furthermore, it is preferable to form the mode conversion region so that the size of the waveguide gradually changes in the direction of propagation of light.

When the mode conversion region comprises a multilayer structure waveguide, it is also possible to form the mode conversion region so that the size of the waveguide in the horizontal direction, in the layer-stack direction or both in the horizontal direction and in the lateral direction to the layer gradually changes in the direction of propagation of light.

According to the semiconductor optical functional device of the present invention, it is possible to further improve the reduction of the reflectivity by a conventional angled facet structure because a mode conversion region having a facet diagonal to the propagation direction of light changes the diameter of the beam of propagated light while keeping the light as a plane wave, that is, the region increases the beam spot size of the light propagated toward a fiber to be connected from an optical amplifier region, and decreases the beam spot size of the light propagated toward the optical amplifier region from the fiber to be connected. Moreover, because the mode conversion region emits propagated light by changing the diameter of the beam of the light while keeping the light as a plane wave, it is unnecessary to use a lens system for converting a spherical wave to a plane wave for the coupling between the output beam and the fiber though the lens system is used for the prior art.

Moreover, because the mode conversion region is provided, when constituting a semiconductor laser or optical amplifier as an optical amplifier region, it is possible to set the diameter of the beam of transmitted light emitted from a device facet to 5 μm or more with which a practical reflectivity of 1% or less is obtained while keeping the waveguide width at approx. 1 μm capable of decreasing the power consumption.

Furthermore, because the guide layer having a band-gap wavelength shorter than that of the active layer and formed nearby the active layer has a function to prevent the propagated light from diverging and to direct most of the light toward a waveguide, it is possible to decrease the radiation loss and change the beam diameter of the propagated light in the mode conversion region.

By connecting the optical amplifier region with the mode conversion region by a bend waveguide, it is possible to form the mode conversion region into an angled facet structure even when it is not desirable to form the optical amplifier region into an angled facet structure because etching has surface orientation dependence.

By forming an optical amplifier region so as to function as a waveguide-type optical switch having a plurality of waveguides and by forming a mode conversion region at each of the waveguides, the reflectivity at the connection surface between the waveguide-type optical switch and a fiber can be decreased and the coupling loss can be decreased. In this case, by further forming the structure so that the beam divergence angle in each mode conversion region differs for each waveguide, it is possible to use a ordinary low-cost ribbon fiber in which facets of flat end fibers to be connected are aligned.

By forming a carrier-injection structure in a mode conversion region, it is possible to decrease absorption of propagated light and compensate the loss in the mode conversion region.

By gradually changing the size of the waveguide in a mode conversion region in the propagation direction of light, for example, gradually changing the size of the waveguide in the horizontal direction and/or in the lateral direction when the mode conversion region comprises a multilayer structure waveguide, it is possible to change the beam diameter of propagated light while keeping the light as a plane wave. To form the above mode conversion region, it is only necessary to previously form an $SiO_2$ mask for selective deposition before the deposition by using a known selective region deposition technique such as a metal organic chemical vapor deposition (MOCVD) method or a metal organic vapor phase epitaxy (MOVPE) method. Therefore, the fabrication process does not become complicated or the yield is not lowered. Moreover, because the angle of the facet to be tilted can be small, an angled facet waveguide is formed in the etching process without being affected by the surface orientation and thereby, the fabrication process is simplified. Furthermore, because the reflectivity can adequately be lowered even if the error of thickness of the antireflection coating film is loosely set, the fabrication process is simplified. Still further advantages of the present invention will become apparent to those of ordinary skill in the art upon reading and understanding the following detailed description of the preferred and alternate embodiments.

BRIEF DESCRIPTION OF THE DRAWINGS

The invention will be described in conjunction with certain drawings which are for the purpose of illustrating the preferred and alternate embodiments of the invention only and not for the purpose of limiting the same and where in:

FIGS. 7(a) to 7(d) shows an intermediate process of a method for fabricating the semiconductor optical functional device of the present invention shown in FIG. 6, in which FIG. 7(a) is a top view, FIG. 7(b) is a sectional view of the portion shown by the line A—A' of FIG. 7(a), and FIG. 7(c) is a sectional view of the portion shown by the line B—B' of FIG. 7(a), and FIG. 7(d) is a sectional view of the portion shown by the line C—C' of FIG. 7(a);

FIGS. 8(a) to 8(d) are top views and sectional views of the next intermediate process of the portions of the semiconductor optical functional device of the present invention shown in FIGS. 7(a) to 7(d);

FIGS. 9(a) to 9(d) are top views and sectional views of the next intermediate process of the portions of the semiconductor optical functional device of the present invention shown in FIGS. 8(a) to 8(d);

FIGS. 10(a) to 10(d) are top views and sectional views of the next intermediate process of the portions of the semiconductor optical functional device of the present invention shown in FIGS. 9(a) to 9(d);

FIGS. 11(a) to 11(d) are illustrations showing another embodiment of a semiconductor optical functional device of the present invention, in which FIG. 11(a) is a top view, FIG. 11(b) is a sectional view of the portion shown by the line A—A' in FIG. 11(a), FIG. 11(c) is a sectional view of the portion shown by the line B—B' in FIG. 11(a), and FIG. 11(d) is a sectional view of the portion shown by the line C—C' in FIG. 11(a);

FIGS. 12(a) to 12(d) are illustrations showing still another embodiment of the semiconductor optical functional device of the present invention, in which FIG. 12(a) is a top view, FIG. 12(b) is a sectional view of the portion shown by the line A—A' in FIG. 12(a), FIG. 12(c) is a sectional view of the portion shown by the line B—B' in FIG. 12(a), and FIG. 12(d) is a sectional view of the portion shown by the line C—C' in FIG. 12(a);

FIGS. 13(a) to 13(d) are illustrations showing a further embodiment of a semiconductor optical functional device of the present invention, in which FIG. 13(a) is a top view, FIG. 13(b) is a sectional view of the portion shown by the line A—A' in FIG. 13(a), FIG. 13(c) is a sectional view of the portion shown by the line B—B' in FIG. 13(a), and FIG. 13(d) is a sectional view of the portion shown by the line C—C' in FIG. 13(a);

FIGS. 14(a) and 14(b) are illustrations showing a conventional semiconductor optical functional device having a window structure, in which FIG. 14(a) is a schematic block diagram when connecting the semiconductor optical functional device with a flat end fiber and FIG. 14(b) is a schematic block diagram when connecting the semiconductor optical functional device with a spherical lensed fiber;

DESCRIPTION OF THE PREFERRED EMBODIMENTS

Then, embodiments of the semiconductor optical functional device of the present invention will be described below in detail, referring to the accompanying drawings.

EXAMPLE 1

Figure 1:
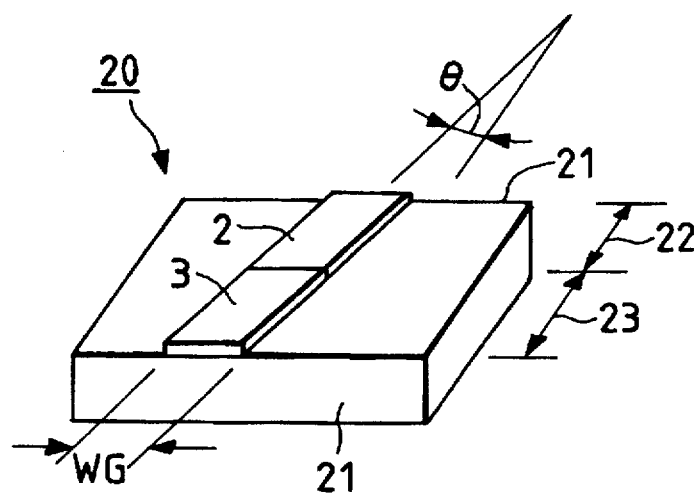
FIG. 1 is a perspective view showing an embodiment of a semiconductor optical functional device of the present invention.

FIG. 1 is a perspective view showing an embodiment of a semiconductor optical functional device of the present invention. In FIG. 1, numeral 1 represents a substrate. The substrate 1 is actually constituted by superimposing buffer layers made of InP or the like on a semiconductor substrate made of InP or the like, but the buffer layers are omitted in FIG. 1. A waveguide-type emitting device 2 constituted by stacking an active layer (core layer) made of InGaAsP or the like, a clad layer made of InP or the like, and a contact layer made of InGaAsP or the like and a waveguide 3 formed by stacking a core layer made of InGaAsP or the like for changing the beam diameter of a plane wave and a clad layer made of InP or the like in a mode conversion region 23 are formed on the optical amplifier region 22 of the substrate 1 so that the device 2 and the waveguide 3 are tilted from the direction of the normal to the facet 21 of the substrate 1 by an angle $\phi$ to constitute a semiconductor optical functional device 20. In the case of the structure in FIG. 1, that is, in the case of a ridge-waveguide structure in which the side of the core layer is exposed, propagated light travels toward the facet 21 while increasing the beam spot size in the depth direction of the substrate 1 just under the waveguide 3.

Figure 2:
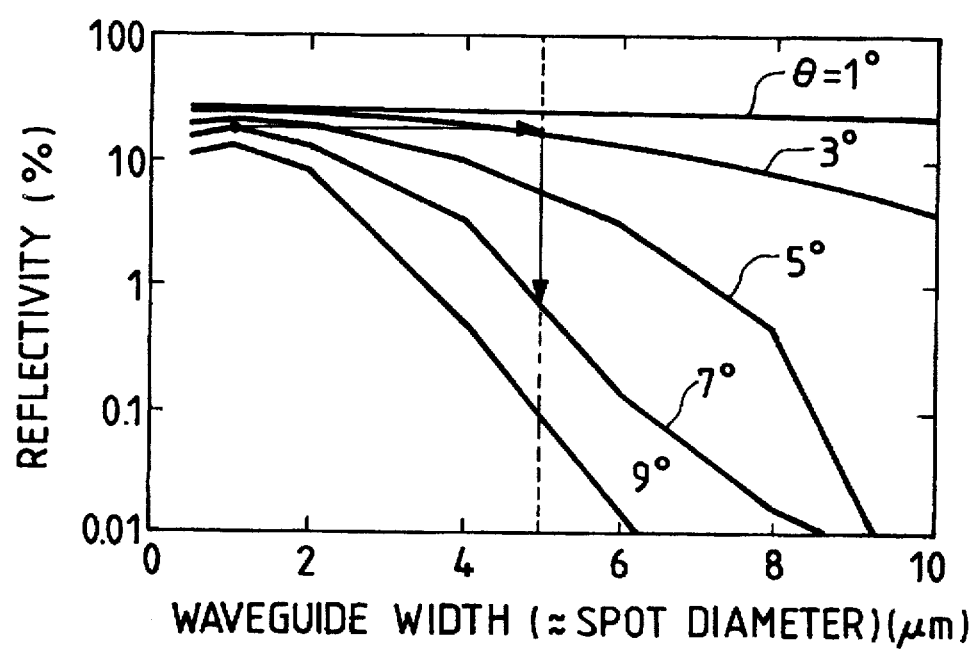
FIG. 2 is a characteristic diagram showing the dependence of the reflectivity on the beam spot when using the angle of an angled facet waveguide as a parameter in order to confirm the effect of the semiconductor optical functional device of the present invention.

FIG. 2 shows the result of calculation of the dependence of the beam spot size on the effective facet reflectivity when a laser beam is made to fall on the facet at an angle of 1° to 9° to the facet in accordance with the three-dimensional BPM (Beam Propagation Method) in order to confirm the effect of the semiconductor optical functional device of this embodiment having the above structure. The parameters used for the calculation are determined as follows: the refractive index of the core layer is 3.38 considering an ordinary semiconductor laser (wavelength=1.55 μm), the thickness of the core layer is 0.3 μm, the refractive index of a clad layer is 3.17, and the width of a core layer, that is, the waveguide width WG in FIG. 1 is changed from 0.5 to 10 μm. The beam spot size is a width when the light intensity changes from the peak value to $1/e^2$. However, when the side of the core layer is exposed, the width is approximately equal to the waveguide width WG.

According to FIG. 2, the facet reflectivity obtained from a conventional typical single-mode waveguide width WG=1 μm and an angled waveguide of θ=7° is 17.6% (shown by a mark ● in FIG. 2). However, when increasing the beam spot size to 5 μm, it is found that the same facet reflectivity is obtained by an angled waveguide of θ=3° or less (shown by mark → in FIG. 2) and a facet reflectivity of 1% or less (shown by mark ↓ in FIG. 2) is obtained when the angle θ is kept at 7°. Therefore, even if an angle of θ=7° is set in the semiconductor optical functional device 20 of this embodiment in FIG. 1, it is possible to decrease the reflectivity by a factor of ten or more compared to a conventional semiconductor optical functional device having an angled facet structure with the same waveguide width (=1 μm) and the same angle if the beam spot size of 1 μm emitted from the emitting device 2 is increased to 5 μm at the facet 21 by the waveguide 3 formed in the mode conversion region 23 for changing the beam spot size. Moreover, because the mode conversion region 23 in which the waveguide 3 is formed emits an output beam having an increased beam spot size while keeping the light as a plane wave, the output beam can be coupled with a fiber only by a flat end fiber. Therefore, it is unnecessary to use a conventionally-used lens system for converting a spherical wave to a plane wave. Moreover, even if the light is emitted from the waveguide of the waveguide-type emitting device 2 serving as a surface light source, it enters a fiber in the form of an almost complete plane wave. Therefore, it is possible to decrease the loss of coupling with the fiber.

When a waveguide structure is vertical to the facet 21 (θ=0°), it is possible to decrease the coupling loss to 1 dB or less. In the case of the semiconductor optical functional device 20 of this embodiment, however, a waveguide is tilted in order to decrease the reflectivity. Therefore, though slightly influenced, it is possible to decrease the coupling loss to 1 dB or less which is almost the same as the case in which the waveguide structure is vertical when θ is kept at approx. 3° or less. Moreover, even if θ is set to 7°, the coupling loss can be decreased to approx. 2 dB which is smaller than a conventional coupling loss. That is, the present invention makes it possible to greatly improve the reduction of the reflectivity by an angled facet structure and also decrease the loss of coupling the output beam with a fiber. Moreover, the present invention makes it possible to realize a low reflectivity at a low power consumption approx. ⅕ smaller than the power consumption when setting a waveguide width to 5 μm because a facet reflectivity of 1% or less is obtained by setting the waveguide width of the waveguide-type emitting device 2 to approx. 1 μm without increasing the waveguide width up to 5 μm. Furthermore, the fabrication process is simplified because the influence of surface orientation is decreased, to an extent corresponding to the decrease of the angle m of the waveguide, in the etching process when forming the angled waveguide.

Though not illustrated, by applying this embodiment to a conventional reflectivity reduction method using an antireflection coating film together, the antireflection coating film is unnecessary or it is possible to set the refractive index and film thickness error of the antireflection coating film more loosely than conventional. Therefore, the fabrication process is simplified because one step of the fabrication process can be eliminated for the former case and a desired low reflectivity can be obtained without using a precision film-forming apparatus provided with a film thickness monitor even for the latter case. Particularly, because the reflectivity decreases inversely proportionally to the spot size, a facet reflectivity of approx. 1% can be realized by setting the angle of a waveguide to approx. 4° if the spot size is increased up to approx. 10 μm by a mode conversion region even if the waveguide width of the waveguide-type emitting device 2 is set to 1 μm. Therefore, it is also possible to decrease the loss of coupling with a fiber to 2 dB. The reason is that an ordinary flat end fiber has a core diameter of approx. 10 μm and thereby, the spot size becomes equal to the core diameter of the fiber when the size is increased up to 10 μm by the mode conversion region and the loss of coupling with the fiber can be decreased.

It is obvious that a low reflectivity which cannot conventionally be obtained can be obtained through a combination with a conventional reflection reduction method.

To form the waveguide 3 in the mode conversion region 23, it is only necessary to previously form a mask for selective deposition before the deposition by using a known selective region deposition technique such as a metal organic chemical vapor deposition method. Therefore, the fabrication process is not complicated and the yield is not lowered.

EXAMPLE 2

Figure 3:
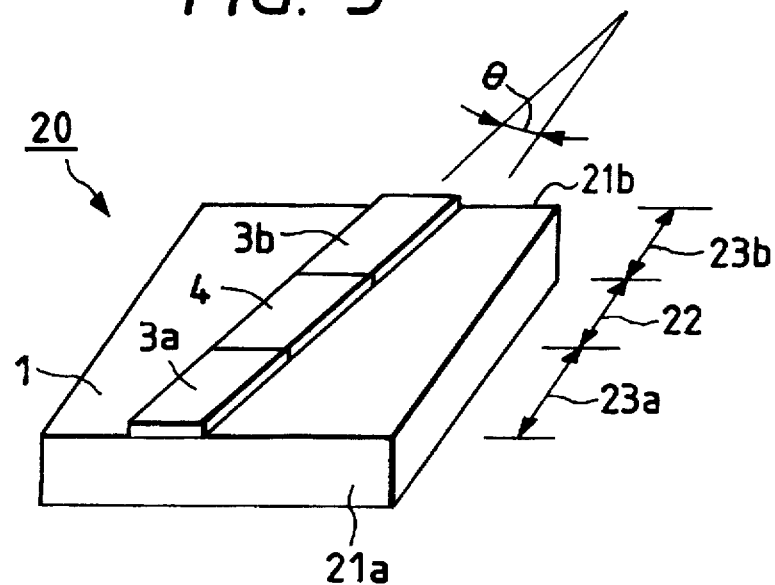
FIG. 3 is a perspective view showing another embodiment of a semiconductor optical functional device of the present invention.

FIG. 3 is a perspective view showing another embodiment of a semiconductor optical functional device of the present invention. In FIG. 3, the same portion as the component portions in FIG. 1 are designated by the same symbols and their detailed description will be omitted. A semiconductor optical functional device 20 of this embodiment is different from embodiment 1 in that a waveguide-type optical amplifier 4 is formed on a substrate 1 diagonally to an optical amplifier region 22, mode conversion regions 23a and 23b are formed at the both ends of the optical amplifier region 22, and waveguides 3a and 3b for changing the beam spot size are formed in the mode conversion regions respectively by tilting the waveguides 3a and 3b by an angle m to facets 21a and 21b.

This structure makes it possible to obtain the advantages as those of embodiment 1. Therefore, it is possible to obtain a semiconductor optical functional device having an optical amplifier function and realizing improvement of reduction of the reflectivity by an angled facet structure, reduction of the loss of coupling with a fiber, and low power consumption. When the facet 21b is used as an incoming facet and the facet 21a as an output facet, the waveguide 3b provided in the mode conversion region 23b on the facet 21b side decreases the beam spot size of the light directed from a fiber (not illustrated) to the facet 21b and propagates the light to an optical amplifier 4 and the waveguide 3a provided in the mode conversion region 23a of the facet 21a propagates the light emitted from the optical amplifier 4 to the facet 21a while increasing the beam spot size of the light.

Figure 4:
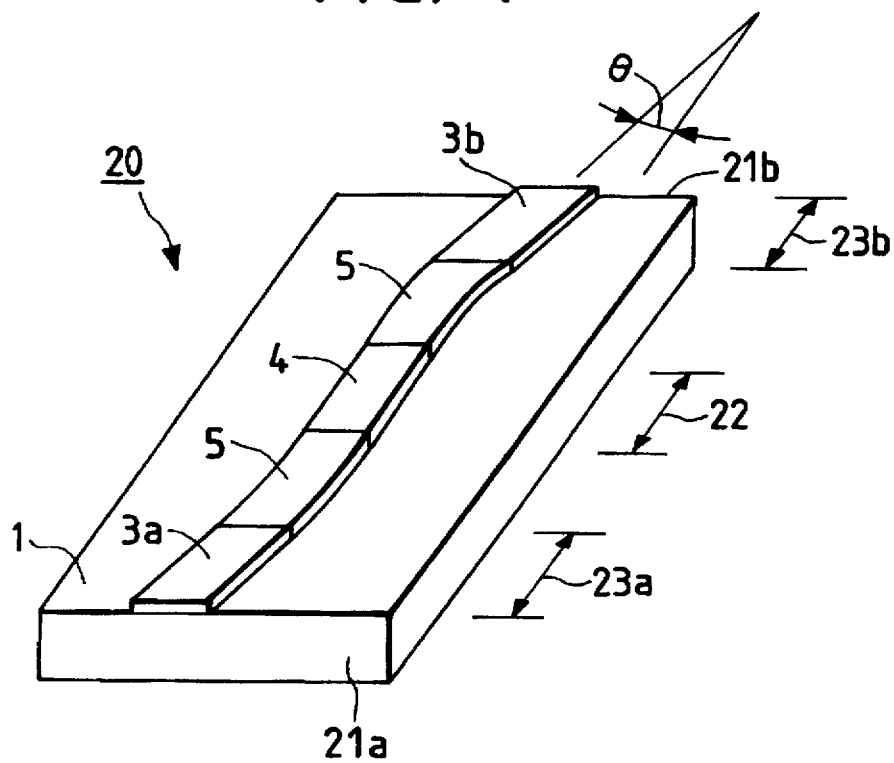
FIG. 4 is a perspective view showing still another embodiment of a semiconductor optical functional device of the present invention.

To obtain the same advantages, it is not always necessary to form the mode conversion regions 23a and 23b nearby the optical amplifier region 22. It is also possible to connect the regions 23a and 23b by a bend waveguide 5 as shown in FIG. 4. This arrangement is preferable when, for example, the etching in the device fabrication process has an dependence on the face orientation and when it is undesirable to form devices into angled facet structures in the optical amplifier region.

Figure 5:
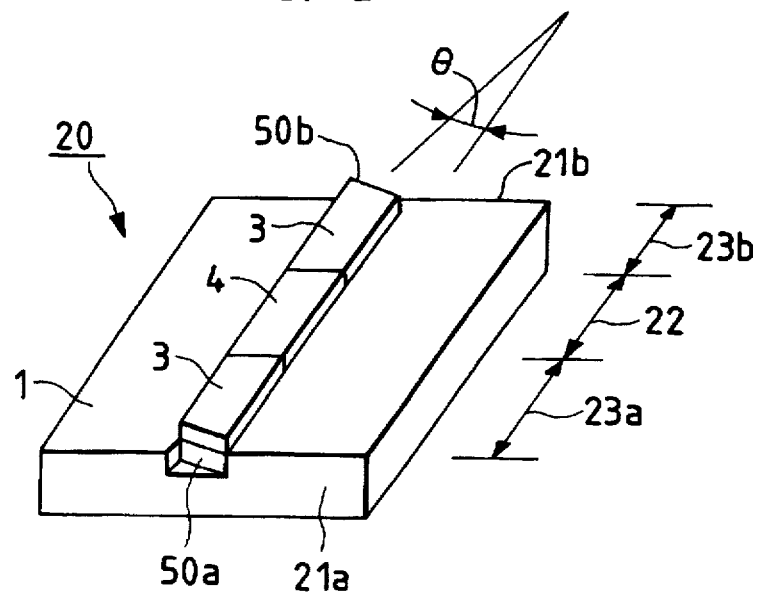
FIG. 5 is a perspective view showing a further embodiment of a semiconductor optical functional device of the present invention.

Moreover, to obtain the same advantages, it is not always necessary to use the facets 21a and 21b which are cleavage faces of an angled facet structure. As shown in FIG. 5, it is also possible to form facets 50a and 50b so that they are oblique to the waveguide direction by an ordinary photolithography and a dry or wet etching process.

EXAMPLE 3

Figure 6:
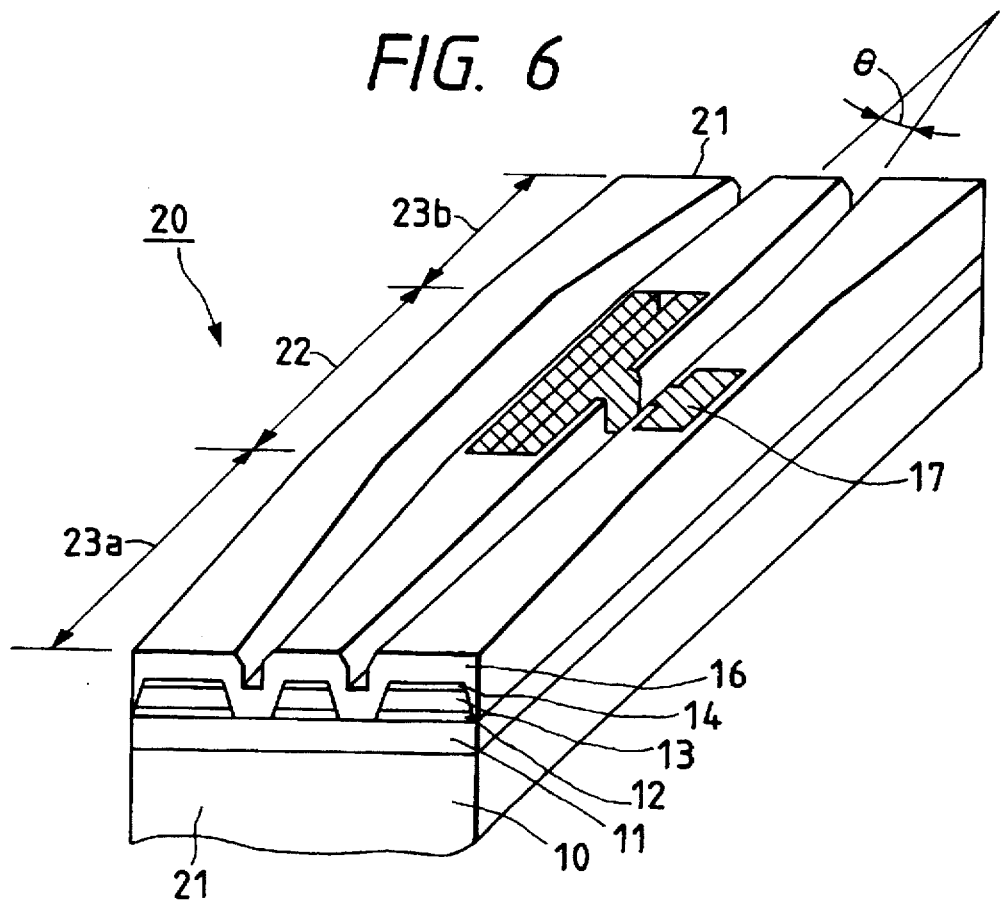
FIG. 6 is a perspective view showing a still further embodiment of a semiconductor optical functional device of the present invention.
Figure 8A:
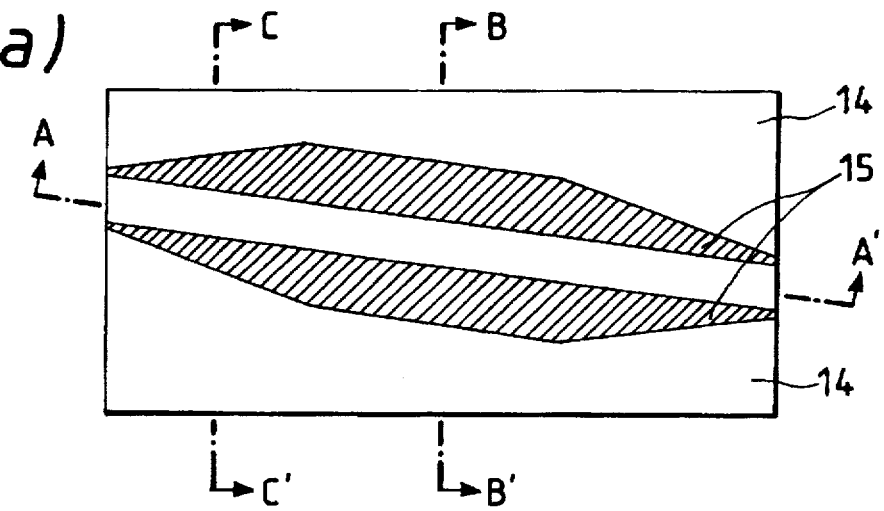
Figure 8A:
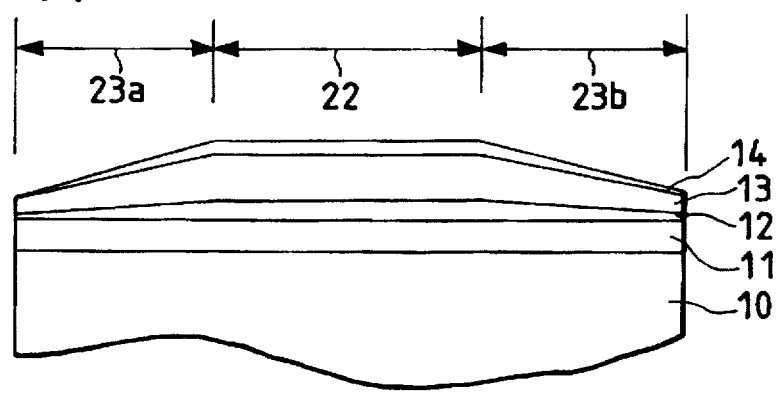
Figure 8A:
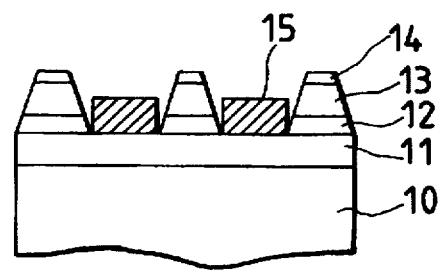
Figure 8A:
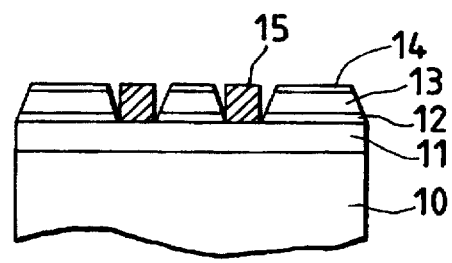

FIG. 6 is a perspective view showing a further embodiment of a semiconductor optical functional device of the present invention, in which the present invention is applied to a ridge-type waveguide structure the sides of the active layer of which is exposed.

In FIG. 6, symbol 10 represents an InP substrate, and an InP buffer layer 11 is formed on the InP substrate 10. Moreover, an InGaAsP active layer 12, a top clad layer 13 made of InP, and an InGaAsP contact layer 14 are successively formed in multilayer in an optical amplifier region 22 and mode conversion regions 23a and 23b sandwiching the region 22 on the InP buffer layer 11. Moreover, a polyimide film 16 serving as an insulating film is so formed as to cover the whole surface and a p-electrode 17 is formed on the optical amplifier region 22. In the case of this embodiment, the optical amplifier region 22 is formed so as to function as an optical amplifier. Furthermore, the mode conversion regions 23a and 23b are formed so that the thickness of the waveguide gradually decreases toward facets 21a and 21b from the optical amplifier region 22 and also obliquely formed at an angle m to the normal to the facets 21a and 21b.

A method for fabricating a semiconductor optical 30 functional device 20 of this embodiment thus constituted will be described below referring to FIGS. 7 to 10. This fabrication method is one of the methods for fabricating a semiconductor optical functional device of this embodiment without complicating the process by using a known selective region deposition technique.

FIG. 7(a) is a top view, FIG. 7(b) is a sectional view of the portion shown by the line A—A' in FIG. 7(a), FIG. 7(c) is a sectional view of the portion shown by the line B—B' in FIG. 7(c), and FIG. 7(d) is a sectional view of the portion shown by the line C—C' in FIG. 7(a). FIGS. 7(a) to 7(d) similarly show top views and sectional views of the same portion. As shown by sectional views in FIGS. 7(b) to 7(d), InP of the material of a buffer layer 11 is deposited on the InP substrate 10 by a MOCVD method.

Then, in FIG. 8, an $SiO_2$ layer is deposited on the InP buffer layer 11 and thereafter, an $SiO_2$ mask 15 for selective region deposition is formed by etching the $SiO_2$ mask by a photolithography technique. Then, an active layer 12 made of InGaAsP, a top clad layer 13 made of InP, and a contact layer 14 made of InGaAsP are'successively deposited by the MOCVD method to form a multilayer structure. In this case, as shown in FIGS. 7(a) to 7(d), the layers are not deposited on the $SiO_2$ mask but they are selectively deposited only on a portion where the InP buffer layer 11 is exposed. Moreover, since the growth rate has a tendency to be high in the area where the width of the $SiO_2$ mask is great and be low in the area where it is small, the mode conversion regions 23a and 23b are so formed that their thicknesses are gradually decreased toward the facets 21a and 21b along a waveguide. About this type of selective region deposition technique, there is a deposition technique described in Modulator integrated multiwavelength light source grown by in-plane thickness control selective area MOVPE, Aoki et al., Technical Papers of the Institute of Electronics and Communication Engineers of Japan MW94-33, OPE94-26 (1994-6), by pp. 67–72, and it is possible to use the technique.

Then, in FIG. 9, the surface is covered with the polyimide film 16 as an insulating film and thereafter, a window 27 is opened in the optical amplifier region 22 serving as an optical amplifier by a normal photolithography technique to selectively remove the polyimide film 16 by CF4 plasma etching as shown in FIGS. 9(a) and 9(b).

Figure 10A:
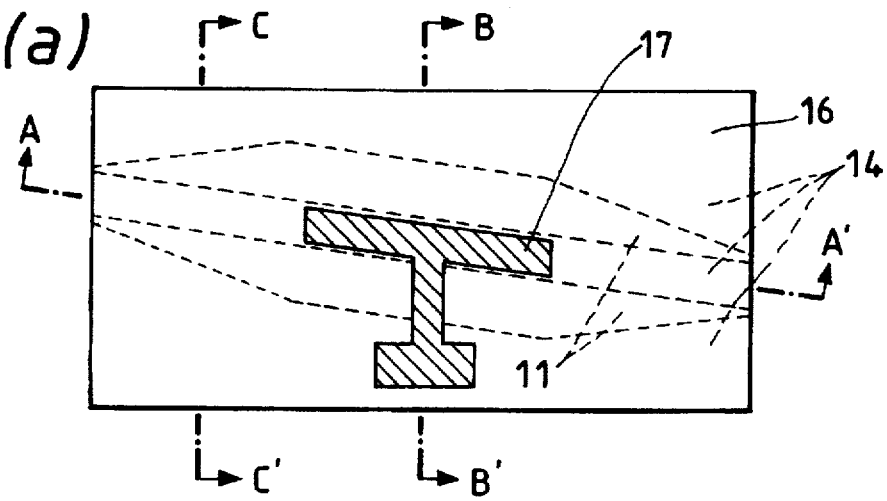
Figure 10A:
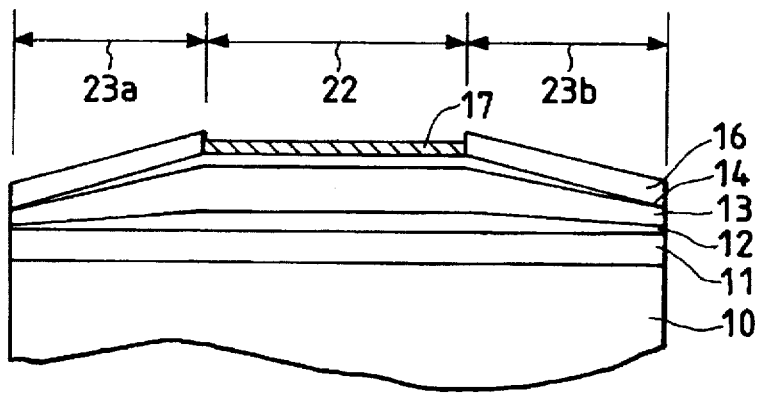
Figure 10A:
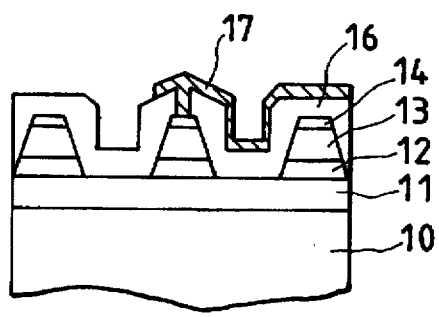
Figure 10A:
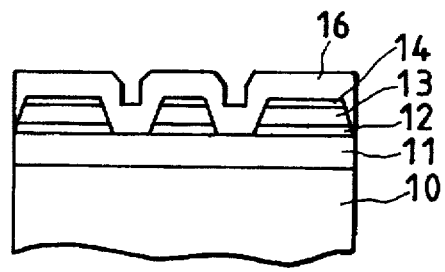
Figure 11A:
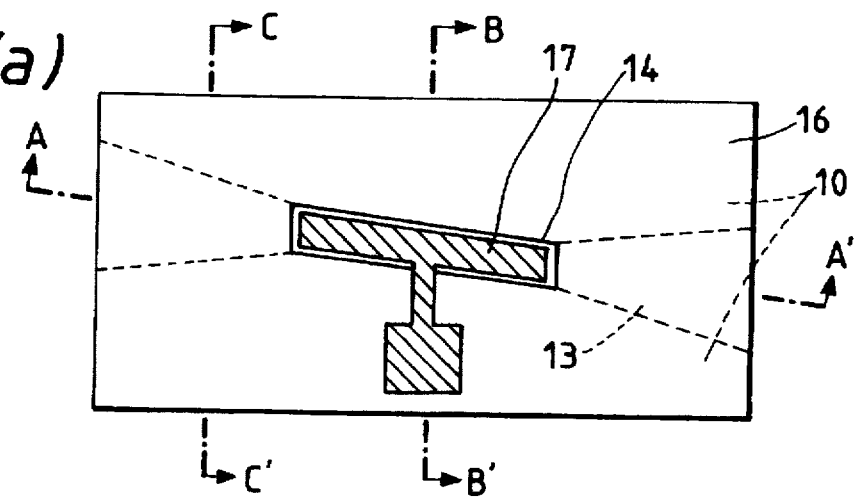
Figure 11A:
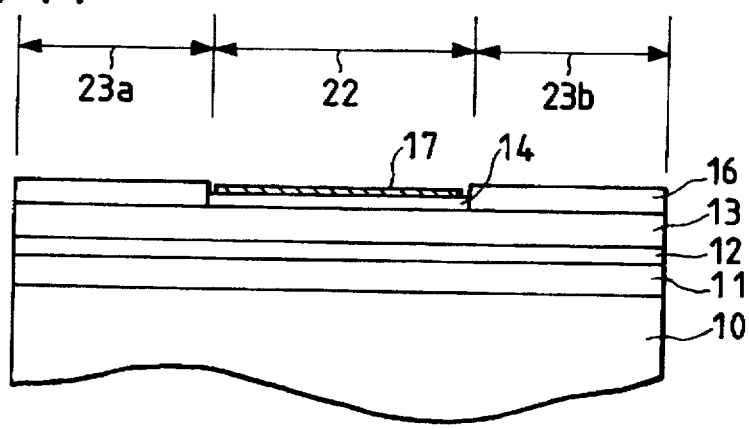
Figure 11A:
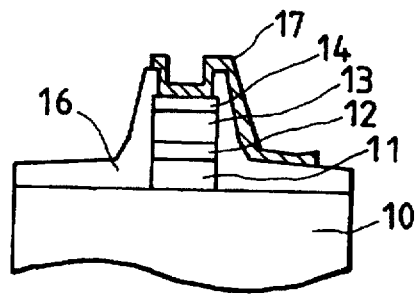
Figure 11A:
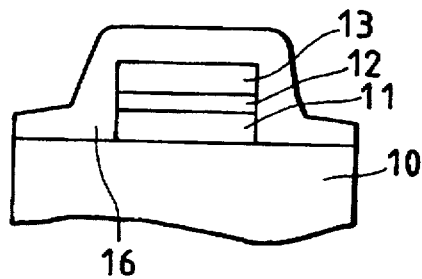
Figure 12A:
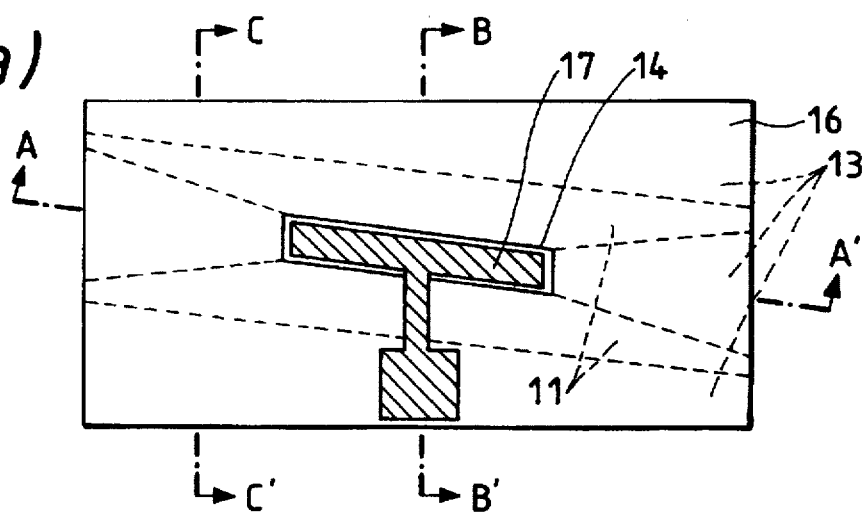
Figure 12A:
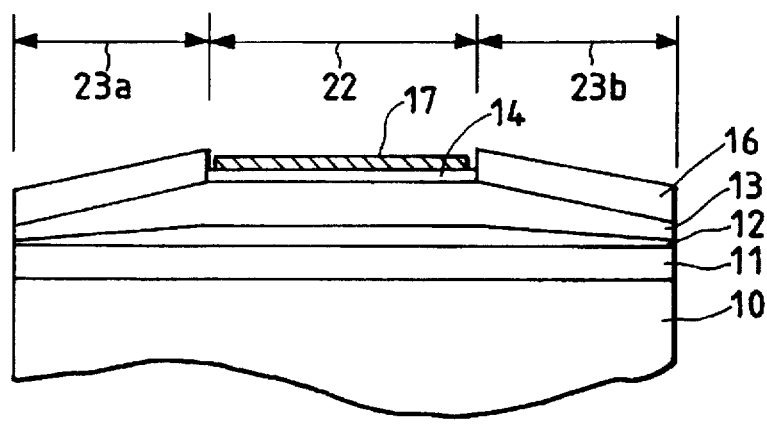
Figure 12A:
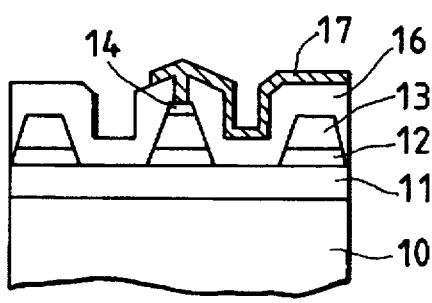
Figure 12A:
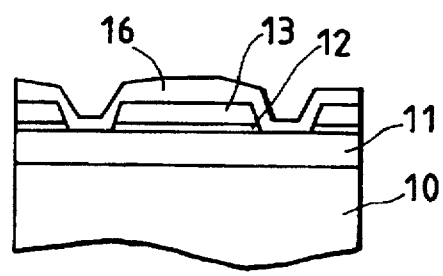
Figure 13A:
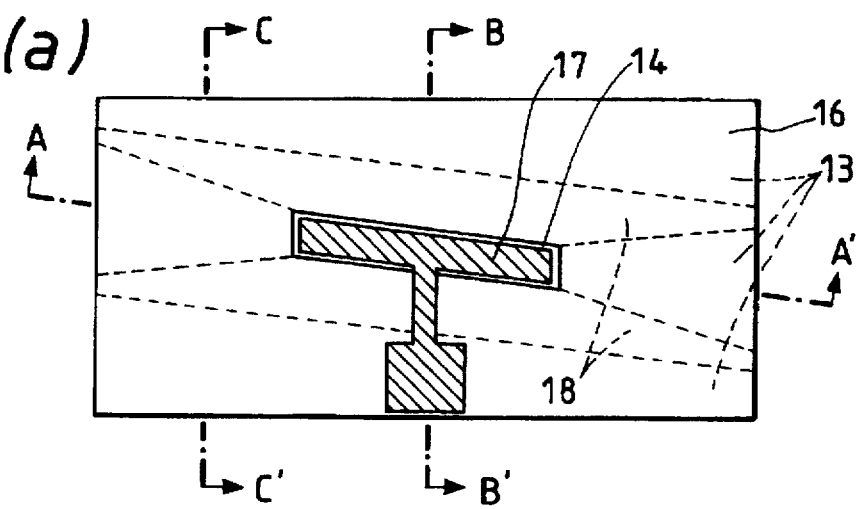
Figure 13A:
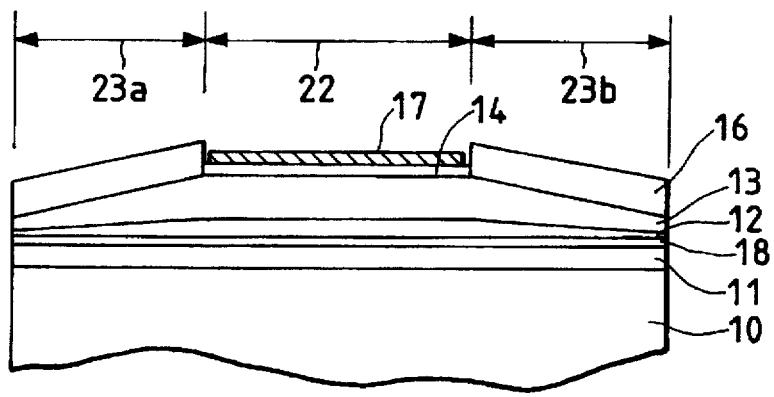
Figure 13A:
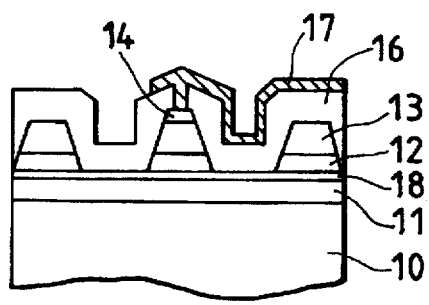
Figure 13A:
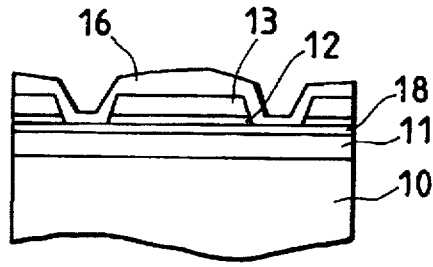

Lastly, in FIG. 10, metal such as Ti/Au alloy is vacuum-deposited and thereafter, patterning is performed by a photolithography technique as shown in FIG. 10(a) to form the p-electrode 17. In the case of this embodiment, the semiconductor optical functional device 20 is illustrated like a rectangular-parallelepiped substrate 10 from the beginning for convenience of explanation. However, it is needless to say that an ordinary circular wafer is actually used and lastly formed into a rectangular parallelepiped. Moreover, though not illustrated, it is a matter of course that metal such as Ti/Pt/Au alloy is vacuum-deposited to form an n-electrode at the back of the substrate 10.

Thus, the fabrication method shown in FIGS. 7 to 10 makes it possible to integrate the mode conversion regions 23a and 23b similarly to the fabrication process of a conventional semiconductor optical amplifier structure. Moreover, the semiconductor optical functional device 20 provided with the optical amplifier of this embodiment has advantages of reducing the reflectivity, the loss of coupling with a fiber, and power consumption, as in the semiconductor optical functional device of FIG. 3. Furthermore, because the current injected from the p-electrode 17 is also injected into the mode conversion regions 23a and 23b, it is possible to decrease the absorption of propagated light in the mode conversion regions 23a and 23b and compensate the loss.

In the above description, the mode conversion regions 23a and 23b are fabricated simultaneously with the optical amplifier in the optical amplifier region 22 and the number of processes are equalized with the number of deposition processes of an ordinary semiconductor optical amplifier structure. However, it is also possible to separately form the mode conversion regions 23a and 23b instead of fabricating them simultaneously with the optical amplifier region 22. In this case, it is possible to decrease the power consumption because current is selectively injected into the optical amplifier in the optical amplifier region 22. Moreover, it is a matter of course that a semiconductor laser can be formed in the optical amplifier region 22 instead of a semiconductor optical amplifier.

Moreover, in the above description, a case has been described in which the width of a waveguide for changing the beam spot size in the mode conversion regions 23a and 23b is only changed in the lateral direction. However, as shown in FIGS. 11(a) to 11(d), it is also possible to realize a structure changing in the horizontal direction.

In this case, it is not necessary to perform selective region deposition but it is only necessary to correct the shape of a photomask when photolithography is performed. Therefore, the semiconductor optical functional device of the present invention can be realized without complicating the process.

As shown in FIGS. 12(a) to 12(d), it is a matter of course that the semiconductor optical functional device of the present invention can be realized by simultaneously executing the methods for changing the waveguide widths in the mode conversion regions 23a and 23b in the lateral direction and in the layer-stack plane. In this case, the above-described advantages of decreasing the reflectivity, the loss of coupling with a fiber, and power consumption are enhanced both in the lateral direction and the in-stack-plane direction. Moreover, in addition to these advantages, the loss of coupling with a fiber approaches zero and more ideal condition is obtained because it is possible to control the intensity distribution of the input/output beam so as to be approximated to a circle.

Furthermore, though the active layer 12 is formed just on the buffer layer 11 in the case of this embodiment, it is also possible to form a light guide layer 18 with a band-gap wavelength smaller than that of the active layer 12 nearby the active layer 12 as shown in FIG. 13. The light guide layer 18 has a function to prevent propagated light from diverging and almost directing the light in the waveguide direction. Therefore, by forming the light guide layer 18, it is possible to decrease radiation loss and more adequately change the beam size of propagated light in a mode conversion region.

Moreover, for this embodiment, a case has been described in which the side of an active layer (core layer) is exposed in a ridge-type waveguide structure. However, though not illustrated, it is obvious that the same advantages are obtained from a ridge-type waveguide structure in which the side of an active layer (core layer) is not exposed or a buried-type waveguide structure.

Figure 16:
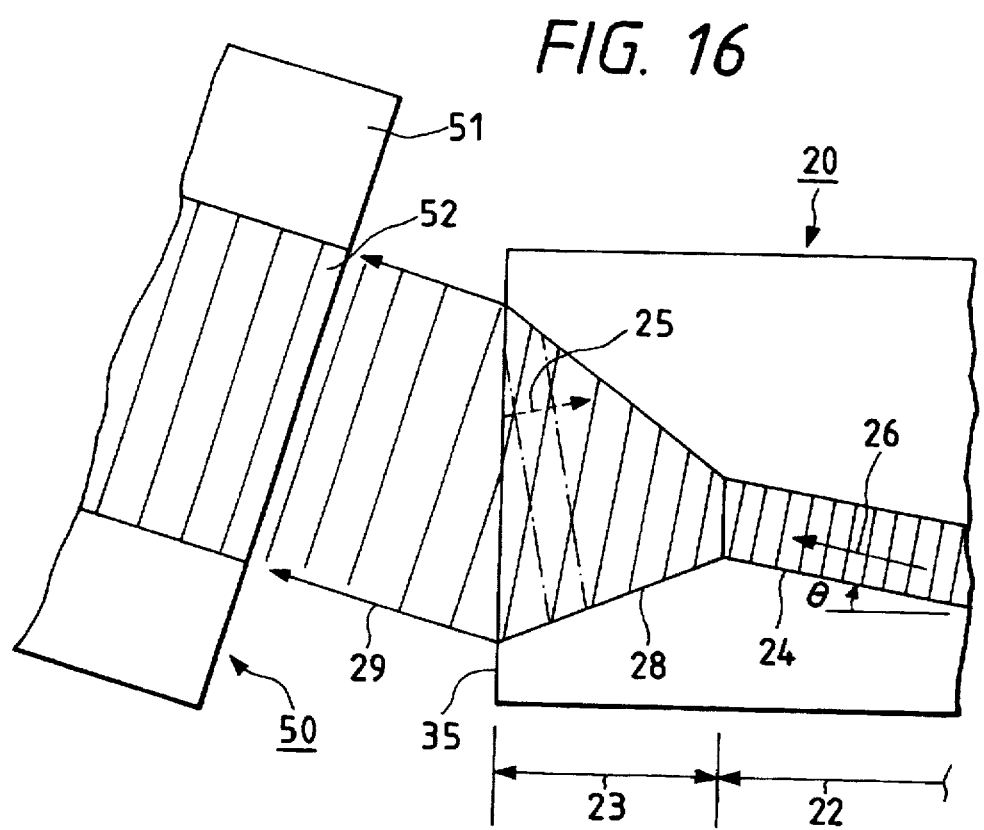
FIG. 16 is a schematic block diagram showing a semiconductor optical functional device of the present invention and a fiber connected to the semiconductor optical functional device.

In this case, functions and advantages of a mode conversion region 23 having a waveguide structure in which the waveguide width gradually changes in the horizontal direction shown in FIGS. 11 to 13 will be more minutely described below referring to FIG. 16. FIG. 16 is a schematic top view showing the state of an optical path at the output facet between the semiconductor optical functional device 20 and a flat end fiber 50 connected to the semiconductor optical functional device 20.

In FIG. 16, an optical amplifier 24 in an optical functional region 22 and a waveguide 28 in the mode conversion region 23 are formed obliquely to a device facet 35. Moreover, the width of the waveguide 28 changes in the horizontal direction. Propagated light 26 emitted from the optical functional region 22 is outputted from the device facet 35 through the mode conversion region 23 and inputted to the optical fiber 50. In this case, the beam spot size of the propagated light 26 is changed in the waveguide 28 of the mode conversion region 23 and outputted while the light 26 is kept as a plane wave. However, because the waveguide 28 is formed obliquely to the device facet 35, reflected light 25 is not propagated to the optical functional region 22. Therefore, the facet reflectivity further decreases compared to the conventional case of only an angled waveguide or only a window structure. That is, the facet reflectivity is further decreased by the angled waveguide. Moreover, because the window structure is unnecessary, the device structure can be formed without adding the burying-deposition process. Therefore, the yield is not lowered. Furthermore, there is an advantage that, device structure with a desired angle can easily be formed because a tilt angle θ for obtaining a desired facet reflectivity can be smaller than an angle estimated from the waveguide width of the semiconductor amplifier because of the reduction of the facet reflectivity by the angled waveguide and thereby, the influence of difference in an etching shape due to crystal orientation can be decreased than conventional.

To decrease power consumption by improving the efficiency of injecting carriers into a semiconductor laser or semiconductor amplifier, a waveguide width of approx. 1 μm is generally preferable. In the case of the waveguide width of 1 μm, however, the facet reflectivity reaches approx. 18% at most only by using an angled facet structure of, for example, θ=7° as shown in FIG. 2 and therefore, an practical facet reflectivity of 1% or less cannot be obtained until the waveguide width comes to 5 μm or more. However, when setting the waveguide width of a semiconductor laser or semiconductor amplifier to 5 μm, the power consumption increases five times larger than the case of a waveguide width of 1 μm. However, the semiconductor optical functional device of the present invention makes it possible to decrease the power consumption because the reflectivity can be decreased while keeping the waveguide width of a semiconductor laser or semiconductor amplifier formed in an optical functional region at approx. 1 μm with which the power consumption can be reduced.

Figure 14A:
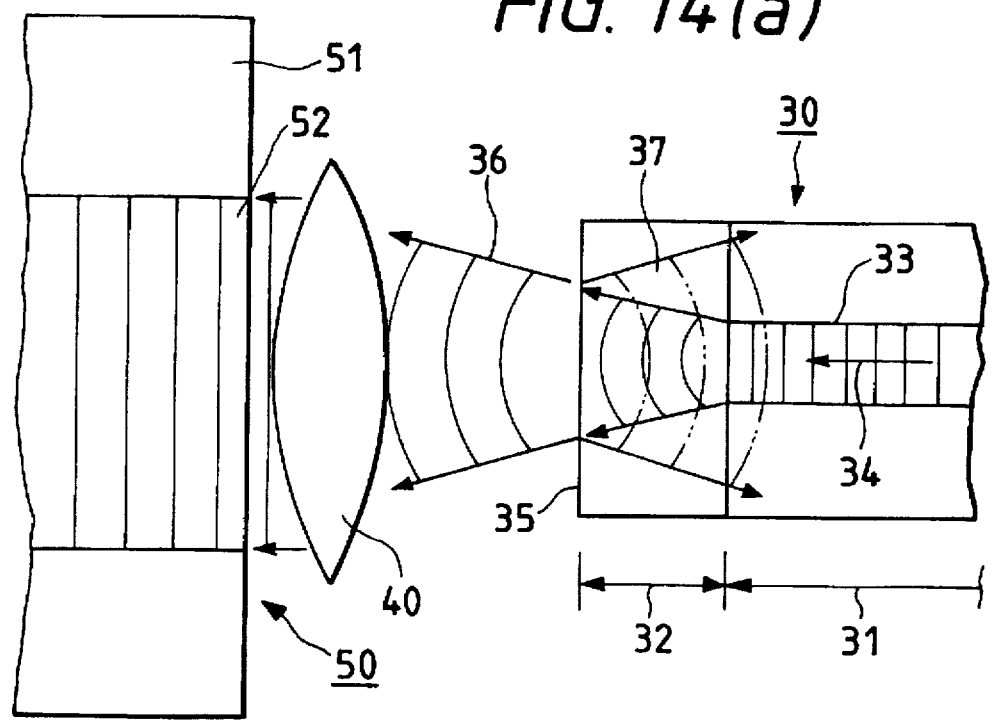
Figure 14B:
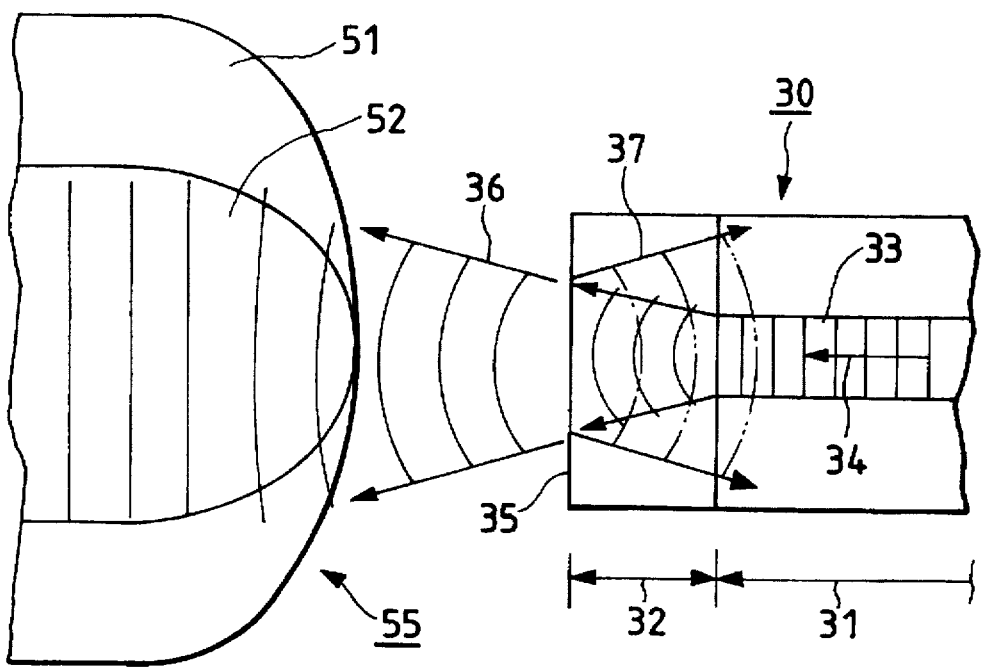
Figure 15:
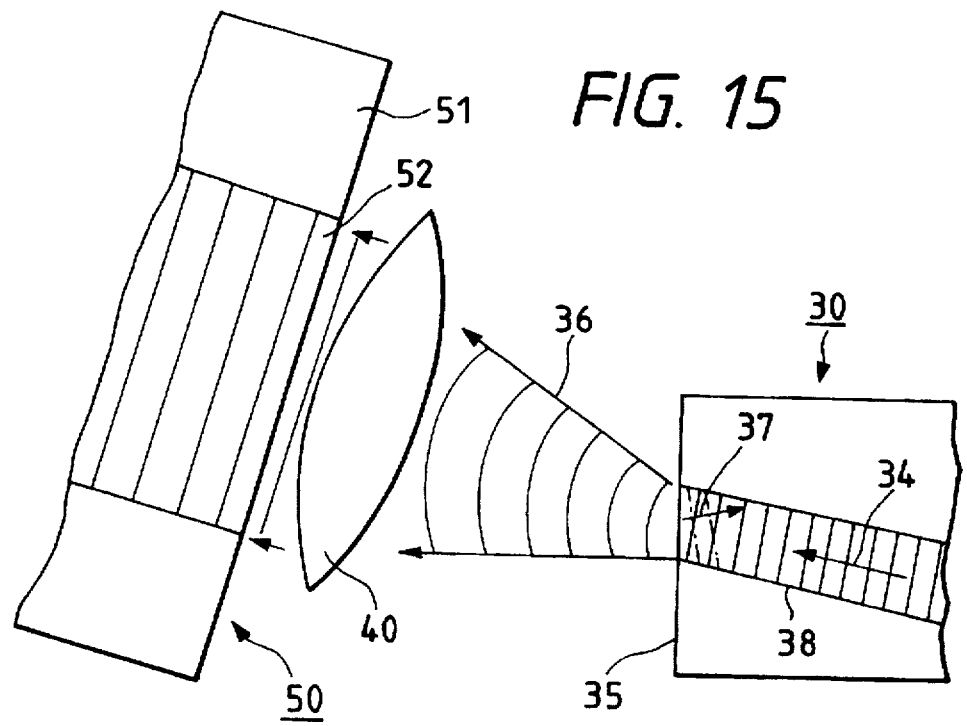
FIG. 15 is a schematic block diagram showing a conventional semiconductor optical functional device having an angled facet structure and a fiber connected to the semiconductor optical functional device.

Moreover, because the mode conversion region 23 changes the beam size of the propagated light 26 while keeping the light 26 as a plane wave, only a flat end fiber is necessary when coupling the output beam with a fiber, the lens system in converting a spherical wave to a plane wave used in the prior art shown in FIGS. 14 and 15 is unnecessary, and the cost can be decreased.

Furthermore, in the waveguide 28 of the mode conversion region 23, the beam size of the propagated light 26 changes while the light 26 is kept as a plane wave and the light 26 is outputted as transmitted light 29. Therefore; even if the optical functional region 22 emits light as a surface light source, the light is inputted to the core section 52 of the fiber 50 in the form of an almost complete plane wave. When the waveguide structure is vertical to the cleavage surface, that is, the device facet 21, it is possible to decrease the loss of coupling with a fiber to 1 dB or less. However, because the waveguide 28 is inclined to the facet 21, the beam shape is slightly influenced by the inclination effect. Therefore, a coupling loss of 1 dB or less is obtained which is almost the same as the case in which the waveguide structure is vertical to the facet 21 when θ is kept at approx. 3° or less. Even if θ is 7°, a coupling loss of approx. 2 dB can be obtained and the loss of coupling with a fiber can be made smaller than that of the prior art. When the propagated light 26 is output as a complete plane wave, the beam shape is not at all influenced by the fact that the waveguide 28 is oblique to the facet 21. However, because the light 26 is a slightly incomplete plane wave, it is slightly influenced by the inclination of the waveguide 28 to the facet 21.

EXAMPLE 4

Figure 17:
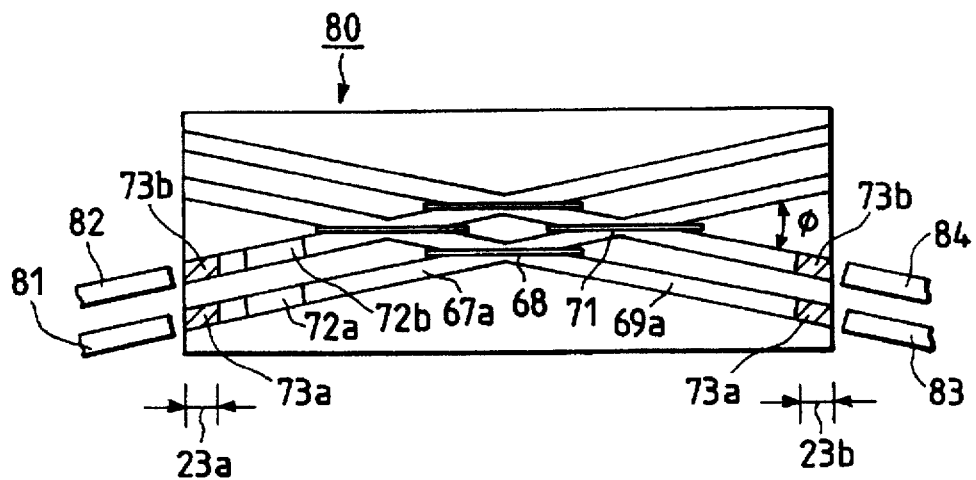
FIG. 17 is a top view showing a still another embodiment of a semiconductor optical functional device of the present invention, which is a block diagram when applying the embodiment to a conventional total internal reflection type 2×2 cross-bar optical switch.

FIG. 17 is a schematic top view showing a further embodiment of a semiconductor optical functional device of the present invention, in which the present invention is applied to a total-internal-reflection-type 2×2 cross-bar optical switch. For easy understanding of this embodiment, the structure and operation of the conventional total-internal-reflection-type 2×2 cross-bar optical switch in FIG. 18 will be described before describing this embodiment.

Figure 18:
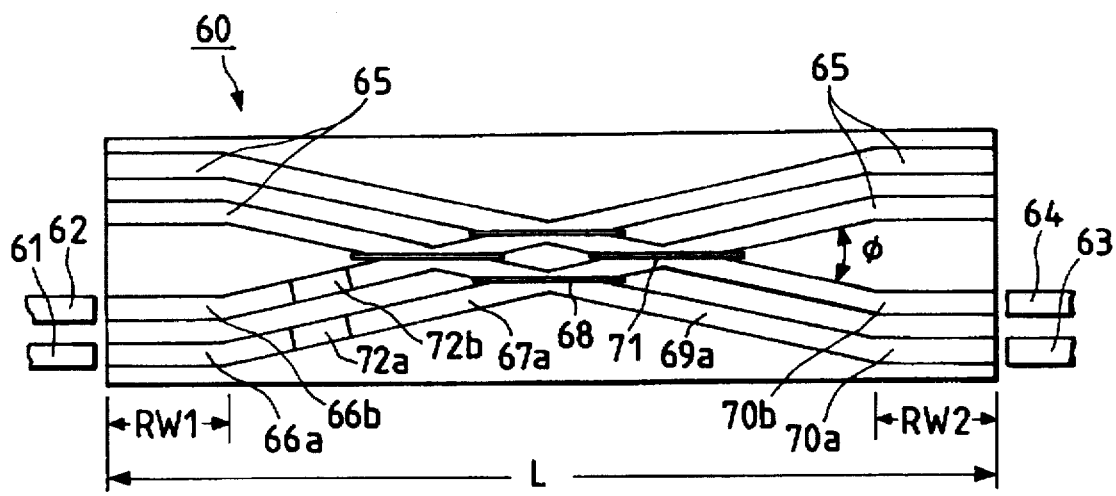
FIG. 18 is a top view showing a schematic structure of a conventional total internal reflection type 2×2 cross-bar optical switch.

In FIG. 18, numeral 60 represents a conventional total-internal-reflection-type 2×2 cross-bar optical switch. The optical switch 60 is a semiconductor optical functional device for optionally switching the optical path of the light incoming from spherical lensed fibers 61 and 62 of the input side to a spherical lensed fiber 63 or 64 of the output side. For example, a case will be described below in which the light incoming from the spherical lensed fiber 61 of the input side is switched to the spherical lensed fiber 63 or 64 of the output side.

The light incoming from the spherical lensed fiber 61 of the input side passes through a bend waveguide 66a and then, passes through a waveguide 67a and reaches a carrier-injection section 68. In this case, to direct the light to the spherical lensed fiber 63, the refractive index of the carrier-injection section 68 is locally decreased by injecting carriers into the section 68. Thereby, the light outputted from the waveguide 67a is totally reflected from the carrier-injection section 68, and it is directed to the spherical lensed fiber 63 of the output side, passing through a waveguide 69a and a bend waveguide 70a. To direct the light to the spherical lensed fiber 64, it is necessary to inject no carrier into the carrier-injection section 68. In this case, the light outputted from the waveguide 67a passes through the carrier-injection section 68 and reaches a carrier-injection section 71. The light is totally reflected from the carrier-injection section 71 by injecting carriers into the carrier-injection section 71 to locally decrease the reflectivity of the section 71. Thus, the light incoming from the spherical lensed fiber 61 is directed to the spherical lensed fiber 64 of the output side. In this case, to compensate the propagation loss of the bend waveguide 66a and waveguide 67a and the reflection loss and transmission loss of the carrier-injection sections 68 and 71, a semiconductor optical amplifier 72a is set in the waveguide. To prevent the semiconductor optical amplifier 72 from generating a laser beam, a low facet reflectivity is necessary. Therefore, an antireflection film is generally vacuum-deposited on the facet of the device 60. In this case, other input/output port 65 are not used. Moreover, because the reflectivity is locally decreased to 1% at most by carrier injection, the total reflection angle cannot be set to 5° or more. Therefore, the optical-switch cross angle φ is 5°. Even if the structure is improved, the angle φ of approx. 10° is a limit. A conventional example of a total-internal-reflection-type cross-bar optical switch provided with a semiconductor optical amplifier is described in IEEE PHOTONICS TECHNOLOGY LETTERS, VOL. 6, NO. 2 FEBRUARY 1994, pp. 218–221.

However, as shown in FIG. 17, a semiconductor optical functional device 80 of this embodiment having a total-internal-reflection-type 2×2 cross-bar optical switch function is different from the conventional example shown in FIG. 18 in that bend waveguide sections RW1 and RW2 are omitted and mode conversion regions 23a and 23b comprising mode conversion waveguides with angled facet 73a and 73b for changing the beam spot size are formed on the input/output facet. The mode conversion regions 23a and 23b make it possible to obtain the advantages of decreasing the facet reflectivity and the coupling loss, as in those described in embodiments 1 to 3. Therefore, inexpensive flat end fibers 81 to 84 can be used as fibers to be connected to the input/output side. Moreover, there is an advantage that an optical switch can be downsized. The bend waveguides 66a and 66b have conventionally been bent at as large a radius as possible in order to decrease the bending loss of propagated light. For example, in a conventional example of the total-internal-reflection-type crossbar optical switch 60 shown in FIG. 18, the size of the bend waveguide sections RW1 and RW2 is approx. 4 mm though the overall length L is 12 mm. However, this embodiment can be downsized to an extent corresponding to the omission of bend waveguides because it does not requires any bend waveguides.

Figure 19:
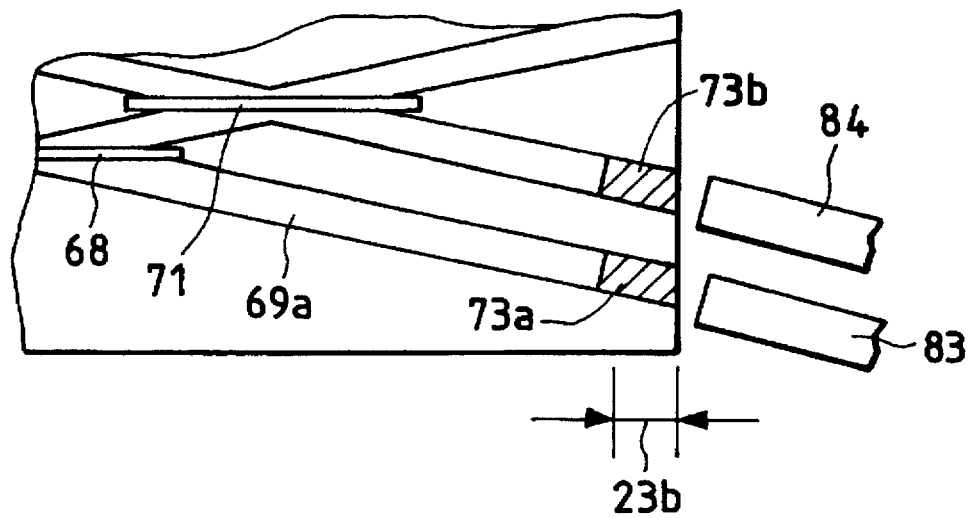
FIG. 19 is an enlarged view showing an output facet of the semiconductor optical functional device of the present invention shown in FIG. 17.
Figure 20:
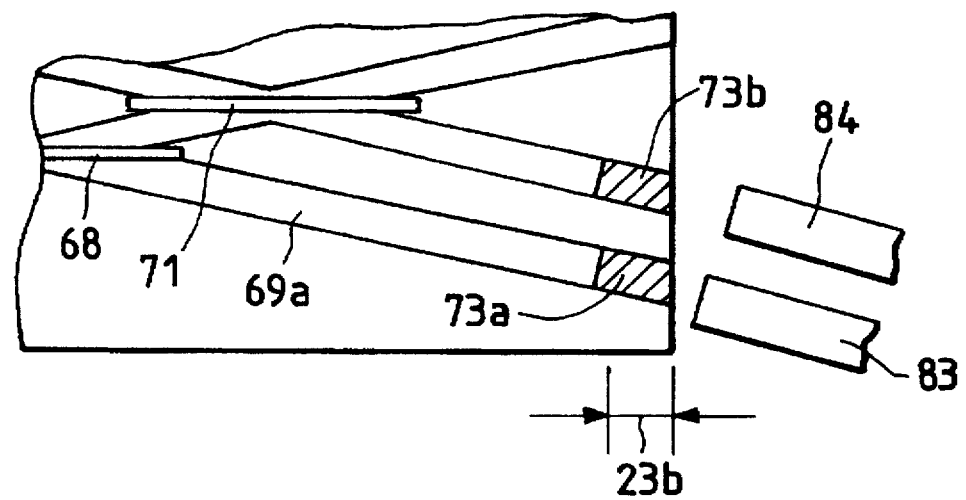
FIG. 20 is an enlarged view showing another output facet of the semiconductor optical functional device of the present invention shown in FIG. 17.

FIGS. 19 and 20 are enlarged views of the output facet and its vicinity shown in FIG. 17. In FIG. 19, the two beams outputted from slant waveguides 73a and 73b in the mode conversion region 23b respectively enter the flat end fibers 83 and 84 while slightly increasing their beam size. In this case, when the two slant waveguides 73a and 73b have the same structure as shown in FIG. 19, the distances between the facets of the slant waveguides 73a and 73b and between the flat end fibers 83 and 84 respectively corresponding to the facets are equalized so as to obtain the lowest coupling loss.

FIG. 20 shows a case in which the structure of the slant waveguide 73a in the mode conversion region 23b to be coupled with the flat end fiber 83 is made different from the structure of the slant waveguide 73b in the mode conversion region 23b to be coupled with the flat end fiber 84. That is, by setting the beam divergence angle of the slant waveguide 73a in the mode conversion region 23b to a value smaller than the beam divergence angle of the slant waveguide 73b in the region 23b, that is, by making the beam divergence angle different for each waveguide in the mode conversion region 23b, a uniform coupling efficiency can be obtained even if arranging the facets of the flat end fibers 83 and 84 are aligned as shown in FIG. 20. Thereby, there is an advantage that uniform coupling with the flat end fibers 83 and 84 is realized by using an ordinary inexpensive flat-end-fiber ribbon without change instead of using the special flat-end-fiber ribbon shown in FIG. 19 in which the facets of the flat end fibers 83 and 84 are slightly deviated from each other.

Preferred embodiments of the present invention have been described above. However, the present invention is not restricted to the embodiments but various design modifications are allowed as long as the modifications are not deviated from the gist of the present invention. For example, it is possible to use a semiconductor material such as a GaAs based material instead of the InGaAsP based material, or it is possible to use a multiple quantum well as an active layer. Moreover, it is a matter of course that the same advantage can be obtained by using not only a semiconductor laser or semiconductor optical amplifier alone but also an integrated light source, optical switch, or modulator obtained by integrating lasers and semiconductor optical amplifier.

According to the present invention, it is possible to further greatly improve the reduction of the facet reflectivity of a conventional angled waveguide by forming a waveguide structure serving as a mode conversion region for changing the beam size of propagated light on the input facet and/or the output facet of the optical function region obliquely to the facet of the side to be connected with a fiber.

Moreover, it is possible to decrease the loss of coupling with a fiber because the angle of the facet for decreasing the reflectivity can be small and the spot beam size is increased by the mode conversion region.

The invention has been described with reference to the preferred and alternate embodiments. Obviously, modifications and alternations will occur to those of ordinary skill in the art upon reading and understanding the present invention. It is intended that the invention to be construed as including all such modifications and alterations in so far they come with the scope of the appended claims or the equivalent thereof.

We claim:

1. A semiconductor optical functional device comprising:

an optical functional region; and a mode conversion region for increasing a beam size of propagated light on a facet in said optical functional region;

wherein the facet of the side to be connected with a fiber in the mode conversion region is provided obliquely to the direction of propagation of light; and wherein said mode conversion region includes a waveguide and is formed so as to gradually change the size of said waveguide in the direction of propagation of light.

2. The semiconductor optical functional device according to claim 1, wherein a guide layer with a band gap wavelength smaller than that of an active layer is formed nearby the active layer which is a part of a layer constituting the optical functional region and the mode conversion region.

3. A semiconductor optical functional device according to claim 1, wherein the mode conversion region is connected with a bend waveguide.

4. The semiconductor optical functional device according to claim 3, wherein a guide layer with a band gap wavelength smaller than that of an active layer is formed nearby the active layer which is a part of a layer constituting the optical functional region, bend waveguide, and mode conversion region.

5. The semiconductor optical functional device according to claim 1, wherein the mode conversion region is formed so as to gradually increase the size of said waveguide in the direction of propagation of light.

6. The semiconductor optical functional device according to claim 1, wherein the waveguide is a multilayer structure waveguide and the size of the waveguide in its horizontal direction is gradually changed in the direction of propagation of light.

7. The semiconductor optical functional device according to claim 1, wherein the waveguide is a multilayer structure waveguide and the size of the waveguide in its lateral direction to the layer is gradually changed in the direction of propagation of light.

8. The semiconductor optical functional device according to claim 1, wherein the waveguide is a multilayer structure waveguide and both the sizes of the waveguide in its horizontal and lateral direction to the layer are gradually changed in the direction of propagation of light.

9. The semiconductor optical functional device according to any one of claims 1 to 8, wherein the optical functional region is constituted so as to function as an optical amplifier.

10. The semiconductor optical functional device according to any one of claims 1 to 8, wherein the optical functional region is constituted so as to function as a semiconductor laser.

11. The semiconductor optical functional device according to any one of claims 1 to 8, wherein the optical functional region is constituted so as to function as a waveguide-type optical switch having a plurality of waveguides and the mode conversion region is formed on each of the waveguides.

12. The semiconductor optical functional device according to claim 11, wherein the beam divergence angle of the mode conversion region formed on each of the waveguides is different for each waveguide.

13. The semiconductor optical functional device according to any one of claims 1 to 8, wherein a carrier-injection structure is formed in the mode conversion region.

* * * * *